(12) United States Patent
Horie

(10) Patent No.: US 6,287,984 B1
(45) Date of Patent: Sep. 11, 2001

(54) APPARATUS AND METHOD FOR MANUFACTURING SEMICONDUCTOR DEVICE

(75) Inventor: Yasuhiko Horie, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/453,548

(22) Filed: Dec. 3, 1999

(30) Foreign Application Priority Data

Jul. 5, 1999 (JP) .................................................. 11-190900

(51) Int. Cl.[7] .................................................. H01L 21/31
(52) U.S. Cl. .......................... 438/758; 118/715; 118/719; 118/724; 118/725; 414/935; 414/937; 414/939
(58) Field of Search ..................................... 118/715, 725, 118/724, 719; 414/937, 939, 935

(56) References Cited

U.S. PATENT DOCUMENTS

| 5,234,528 | 8/1993 | Nishi | 156/345 |
|---|---|---|---|
| 5,433,785 | 7/1995 | Saito | 118/719 |
| 5,735,961 | * 4/1998 | Shimada | 118/724 |
| 5,755,888 | * 5/1998 | Torii et al. | 118/719 |
| 5,849,102 | 12/1998 | Okonogi | 134/19 |
| 5,861,337 | * 1/1999 | Zhang et al. | 438/437 |
| 6,036,781 | * 3/2000 | Ahn et al. | 118/715 |
| 6,149,048 | * 11/2000 | Brearley et al. | 228/33 |

FOREIGN PATENT DOCUMENTS 01292830    11/1989   (JP) .

* cited by examiner

*Primary Examiner*—Richard Elms
*Assistant Examiner*—Pho Luu
(74) *Attorney, Agent, or Firm*—McDermott, Will & Emery

(57) ABSTRACT

A loading area capable of forming a sealed space in co-operation with a reaction chamber is provided. In a state in which the inner space of the reaction chamber is separated from the inner space of the loading area by a shutter plate, the oxygen concentrations in the reaction chamber and the loading area are both adjusted to a specific concentration. After both the oxygen concentrations coincide with each other at the specific value, semiconductor wafers held on a wafer boat are inserted from the loading area into the reaction chamber by a boat lifter.

6 Claims, 4 Drawing Sheets

APPARATUS AND METHOD FOR MANUFACTURING SEMICONDUCTOR DEVICE

BACKGROUND OF THE INVENTION

1. Field of the Invention

The present invention relates to an apparatus and a method for manufacturing a semiconductor device, and particularly to an apparatus and a method for accurately forming a silicon oxide film on the surface of a semiconductor substrate.

2. Description of the Background Art

A silicon oxide film formed by oxidizing a polysilicon film (hereinafter, referred to as "polyoxide film") has been used, for example, as an insulating film between a floating electrode and a control electrode of a flash memory. A known method of forming a polyoxide film includes the steps of disposing a polysilicon film in a vertical batch type oxidizing furnace and supplying an oxidizing gas to the surroundings of the polysilicon film, to oxide the surface of the polysilicon film.

FIG. 3 is a configuration diagram of a related art vertical batch type oxidizing furnace for forming a polyoxide film. The related art vertical batch type oxidizing furnace includes gas flow rate control units 10, 12 and 14 for controlling flow rates of nitrogen gas, oxygen gas and hydrogen gas, respectively. The gas flow rate control units 10, 12 and 14 are communicated to an external burning pipe 16. A burning heater 18 for burning hydrogen gas and oxygen gas to generate steam is provided around the burning pipe 16.

A reaction chamber 22 is connected to the external burning pipe 16 via a gas inlet pipe 20. A heater 24 for heating the gas inlet pipe 20 and the reaction chamber 22 is provided around the gas inlet pipe 20 and the reaction chamber 22. An exhaust passage 26 is provided in the reaction chamber 22. A shutter plate 28 for sealing the inner space of the reaction chamber 22 is provided at the bottom portion of the reaction chamber 22.

The related art vertical batch type oxidizing furnace further includes a wafer boat 32 for holding a plurality of semiconductor wafers 30. The wafer boat 32 is fixed on a boat lifter 36 by means of a boat holder 34. The boat lifter 36 is adapted to carry the wafer boat 32 in the reaction chamber 22 in a condition where the shutter plate 28 is opened, and to seal the inner space of the reaction chamber 22 from the external atmosphere, that is, the atmosphere of a clean room.

A related art method for forming a polyoxide film will be described below with reference to FIG. 4. FIG. 4 is a flow chart showing sequential processing steps carried out for forming a polyoxide film using the related art vertical batch type oxidizing furnace.

In accordance with the related art method, at Step S100, the semiconductor wafers 30 held on the wafer boat 32 are inserted in the reaction chamber 22 by the boat lifter 36. At this time, the reaction chamber 22 has been already heated at about 700° C. by the heater 24. In the insertion stage of the semiconductor wafers 30, a mixed gas of oxygen and nitrogen or an oxygen gas is supplied in the reaction chamber 22 while the flow rate of the gas is controlled at a specific value by the gas flow rate control units 10 and 12 or the single gas flow rate control 12.

By supplying the oxygen containing gas in the reaction chamber 22 in the insertion stage of the semiconductor wafers 30 as described above, organic matters adhering on the surfaces of the wafers can be removed by oxidation. Accordingly, with the above-described insertion treatment, it is possible to enhance uniformity of the thickness of the polyoxide film over the entire surface of each wafer.

After insertion of the semiconductor wafers 30 in the reaction chamber 22, at Step S102, the state in which the above gas is supplied in the reaction chamber 22 is kept for a specific period of time for stabilizing the wafer temperature.

The process goes on to Step S104, at which the reaction chamber 22 is heated to an oxidizing temperature, specifically, about 900° C. by the heater 24.

After the temperature of the reaction chamber 22 reaches the oxidizing temperature, at Step S106, an oxidizing gas is supplied in the reaction chamber 22 via the gas inlet pipe 20, to oxidize the semiconductor wafers 30. At this moment, the flow rate of the oxidizing gas is controlled by the gas flow rate control units 10, 12 and 14, and also the oxidizing gas is heated by the external burning pipe 16. The oxidizing gas may include steam gas produced by reaction of oxygen with hydrogen in the external burning pipe 16, or oxygen gas.

After completion of the oxidizing step, at Step S108, the gas to be supplied in the reaction chamber 22 is changed from the oxidizing gas to nitrogen gas, so that the atmosphere in the reaction chamber 22 is substituted for the nitrogen gas.

At Step S110, the semiconductor wafers 30 are held in the reaction chamber 22 until the temperature of the semiconductor wafers 30 is lowered to a specific value.

After the temperature of the semiconductor wafers 30 is sufficiently lowered, at Step S112, the semiconductor wafers 30 on the wafer boat 32 are taken out from the reaction chamber 22 by the boat lifter 36.

In accordance with the above-described related art method, since the surfaces of the semiconductor wafers 30 are exposed to atmospheric air in the clean room during the period in which the semiconductor wafers 30 are placed outside the reaction chamber 22, organic matters and the like in atmospheric air may adhere on the surfaces of the semiconductor wafers 30. As described above, the organic matters can be removed to some extent by supplying oxygen into the reaction chamber 22 in the insertion stage of the semiconductor wafers 30.

In accordance with the related art method using the related art vertical batch type oxidizing furnace, however, the semiconductor wafers 30 are inserted in the reaction chamber 22 in the state in which the interior of the reaction chamber 22 is opened to atmospheric air in the clean room. In the insertion stage of the semiconductor wafers 30, the concentration of oxygen gas to be supplied in the reaction chamber 22 is generally different from the concentration of oxygen in atmospheric air. As a result, according to the related art method, it is difficult to accurately control the oxygen concentration in the reaction chamber 22, more specifically, to equalize the oxygen concentration in the reaction chamber over the entire region in the insertion stage of the semiconductor wafers 30.

When the semiconductor wafers 30 held on the wafer boat 32 are inserted in the reaction chamber 22, those held near the top portion of the wafer boat 32 pass through the interior of the reaction chamber 22 for a longer distance as compared with those held near the bottom portion of the wafer boat 32. Accordingly, if there occurs a variation in oxygen concentration in the reaction chamber 22 in the insertion stage of the semiconductor wafers 30, the oxidizing rate and the ability of removing organic matters adhering on the semiconductor wafers 30 in the insertion stage of the semiconductor wafers 30 are dependent on the positions of the semiconductor wafers 30. Such dependence on the positions of the semiconductor wafers 30 causes deterioration of uniformity of the polyoxide film. In this way, the related art method has a problem that it is difficult to stably manufacture polyoxide films having uniform qualities over the entire surfaces of the semiconductor wafers 30.

Also in accordance with the related art method, the semiconductor wafers 30 are heated to the oxidizing temperature in the oxygen containing atmosphere. To be more specific, since the temperature rise of the semiconductor wafers 30 is performed in a high temperature region of 700° C. or more in the oxygen containing atomosphere, a slight oxide film is formed on the surface of each semiconductor wafer 30 before the oxidizing treatment performed at the oxidizing temperature of about 900° C As a result, in accordance with the related art method, it is difficult to form an extremely thin polyoxide film on the surface of each semiconductor wafer 30.

SUMMARY OF THE INVENTION

The present invention has been conceived to solve the previously-mentioned problems, and a general object of the present invention is to provide a novel and useful apparatus and method for manufacturing a semiconductor device.

A more specific object of the present invention is to provide an apparatus and a method for manufacturing a semiconductor device, which are capable of accurately forming an extremely thin oxide film on the surface of a semiconductor wafer.

A second object of the present invention is to provide an apparatus and a method for manufacturing a semiconductor device, which are capable of accurately forming an oxide film being desirable in uniformity on the surface of the semiconductor wafer.

The above objects of the present invention are achieved by an apparatus for manufacturing a semiconductor device which is used for forming a silicon oxide film on a semiconductor wafer. The apparatus includes a reaction chamber for exposing the semiconductor wafer to an oxidizing gas at a specific oxidizing temperature. A loading area is provided for forming a sealed space in co-operation with the reaction chamber. A separating member is provided for separating the inner space in the reaction chamber from the inner space in the loading area. A carrier is provided for carrying the semiconductor wafer between the interior of the reaction chamber and the interior of the loading area. The apparatus also includes a first gas flow rate control unit for controlling the flow rate of oxygen flowing into the reaction chamber as well as a second gas flow rate control unit for controlling the flow rate of oxygen flowing into the loading area. An oxygen concentration sensor is provided for separately measuring an oxygen concentration in the reaction chamber and an oxygen concentration in the loading area. The apparatus further includes a control unit for determining an insertion timing of the semiconductor wafer from the loading area into the reaction chamber on the basis of the oxygen concentration in the reaction chamber and the oxygen concentration in the loading area.

The above objects of the present invention are achieved by an apparatus for manufacturing a semiconductor device which is used for forming a silicon oxide film on a semiconductor wafer. The apparatus includes a reaction chamber for exposing the semiconductor wafer to an oxidizing gas at a specific oxidizing temperature. A heater is provided for heating the reaction chamber. A carrier is provided for inserting the semiconductor wafer into the reaction chamber. The apparatus also includes a third gas flow rate control unit for supplying an oxygen containing gas in the reaction chamber as well as a fourth gas flow rate control unit for supplying nitrogen in the reaction chamber. The apparatus further includes a control unit for inserting the semiconductor wafer in the reaction chamber when the reaction chamber is filled with the oxygen containing gas, substituting the atmosphere in the reaction chamber for nitrogen gas from the oxygen containing gas, and then heating the reaction chamber to a specific oxidizing temperature.

The above objects of the present invention are achieved by a method of manufacturing a semiconductor device which is adapted to form a silicon oxide film on a semiconductor wafer. In the inventive method, the semiconductor wafer is set in a loading area which is capable of forming a sealed space in co-operation with a reaction chamber. The inner space of the reaction chamber is separated from the inner space of the loading area. An oxygen concentration in the reaction chamber is made coincident with the oxygen concentration in the loading area at a specific concentration under a condition in which the inner space of the reaction chamber is separated from the inner space of the loading area. The inner space of the reaction chamber is communicated to the inner space of the loading area after the oxygen concentration in the reaction chamber coincides with the oxygen concentration in the loading area at the specific concentration. The semiconductor wafer is carried from the loading area into the reaction chamber. Then, the semiconductor wafer is exposed to an oxidizing gas in the reaction chamber at a specific oxidizing temperature so as to be oxidized.

Other objects and further features of the present invention will be apparent from the following detailed description when read in conjunction with the accompanying drawings.

DESCRIPTION OF THE PREFERRED EMBODIMENTS

First Embodiment

In the following, a first embodiment of the present invention will be described with reference to FIGS. 1 and 2.

Figure 1:
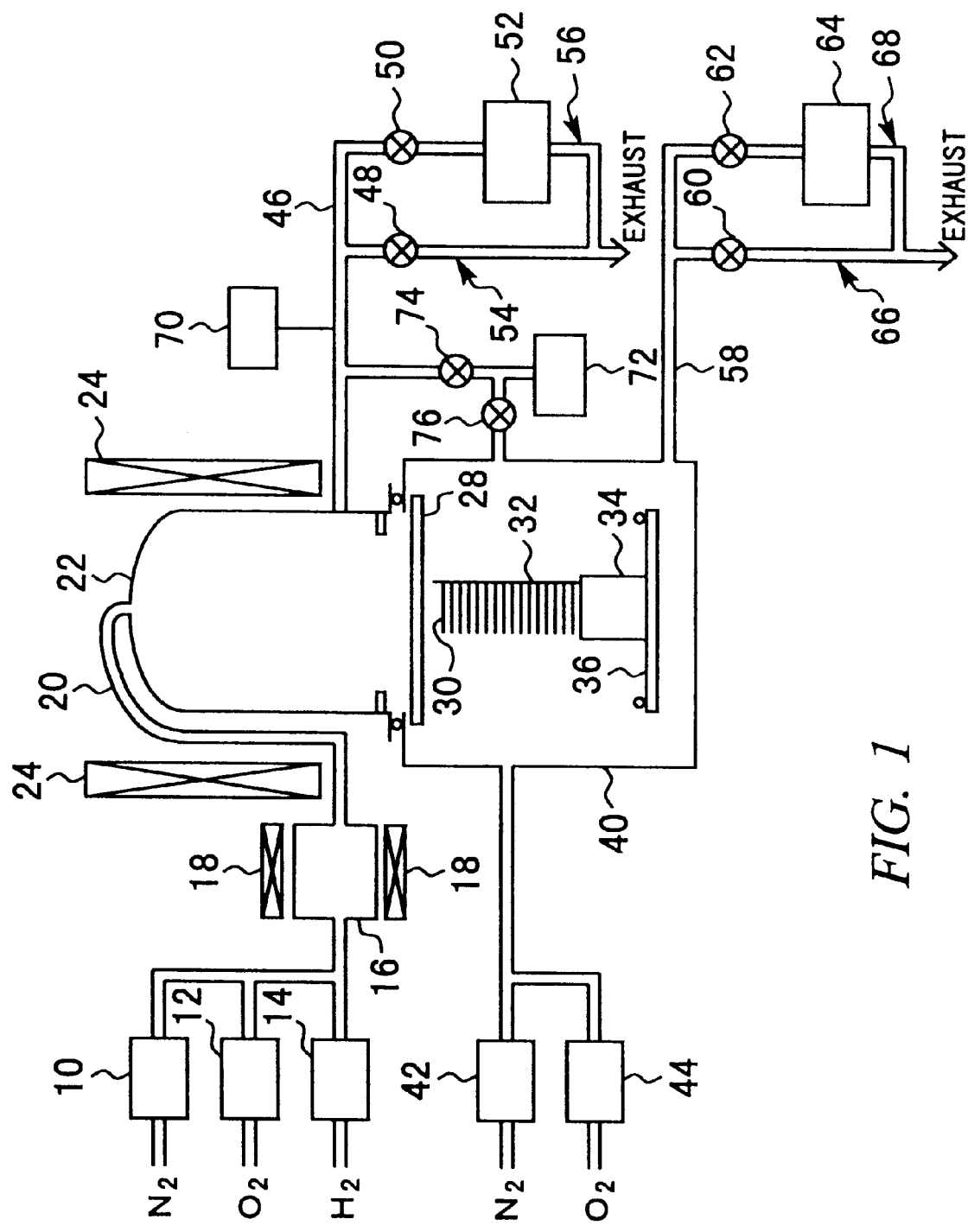
FIG. 1 is a configuration diagram showing an apparatus for manufacturing a semiconductor device practiced as a first embodiment of the present invention.
Figure 2:
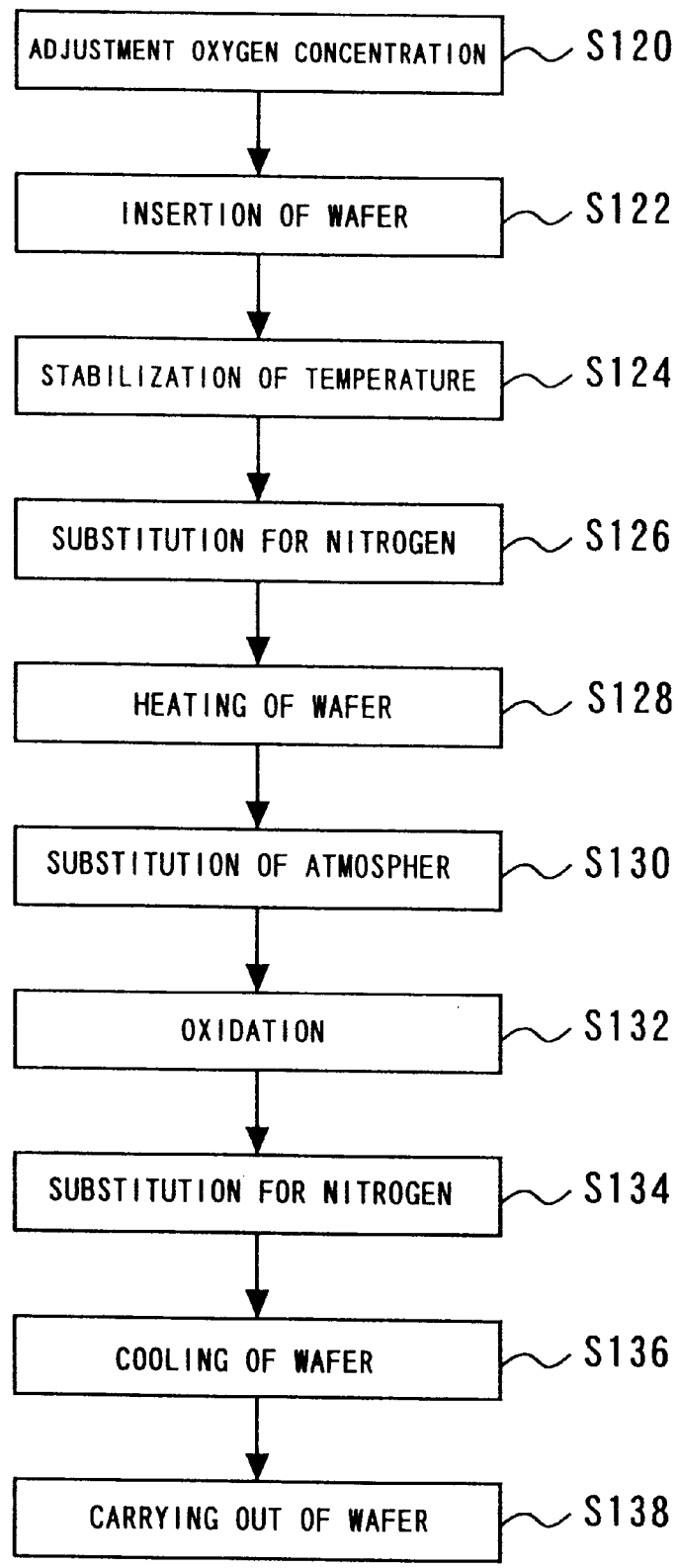
FIG. 2 is a flowchart showing a sequential processing steps performed by the apparatus shown in FIG. 1 for forming an oxidation film on a semiconductor wafer.
Figure 3:
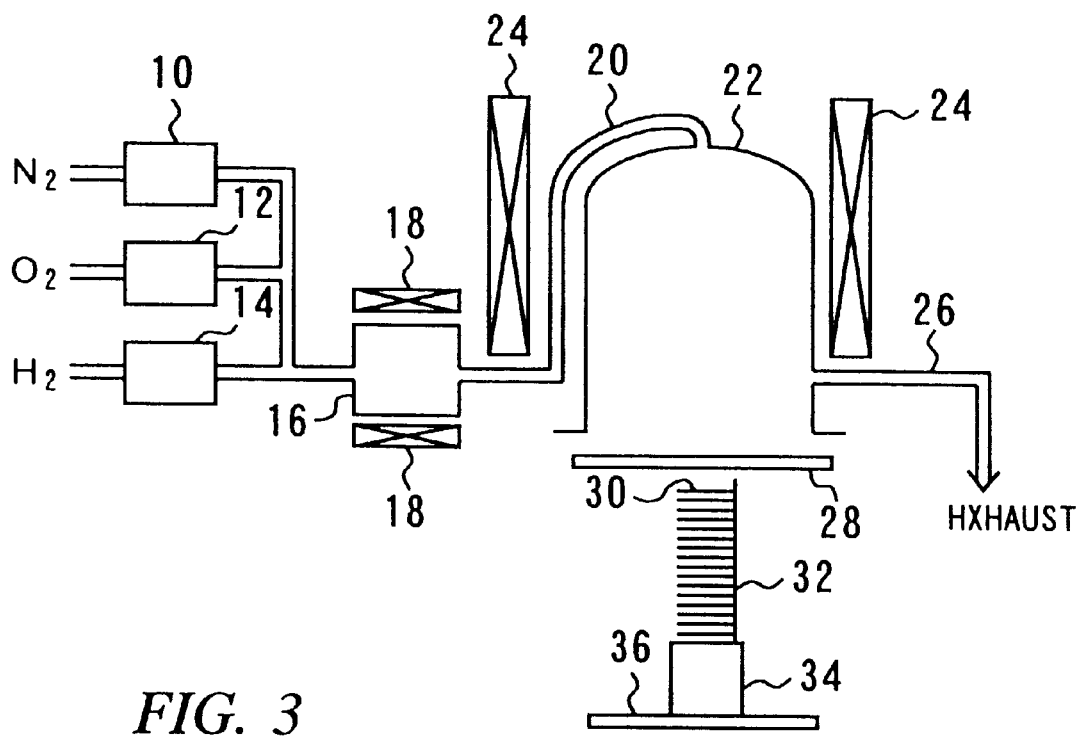
FIG. 3 is a configuration diagram showing a related art apparatus for manufacturing a semiconductor device.
Figure 4:
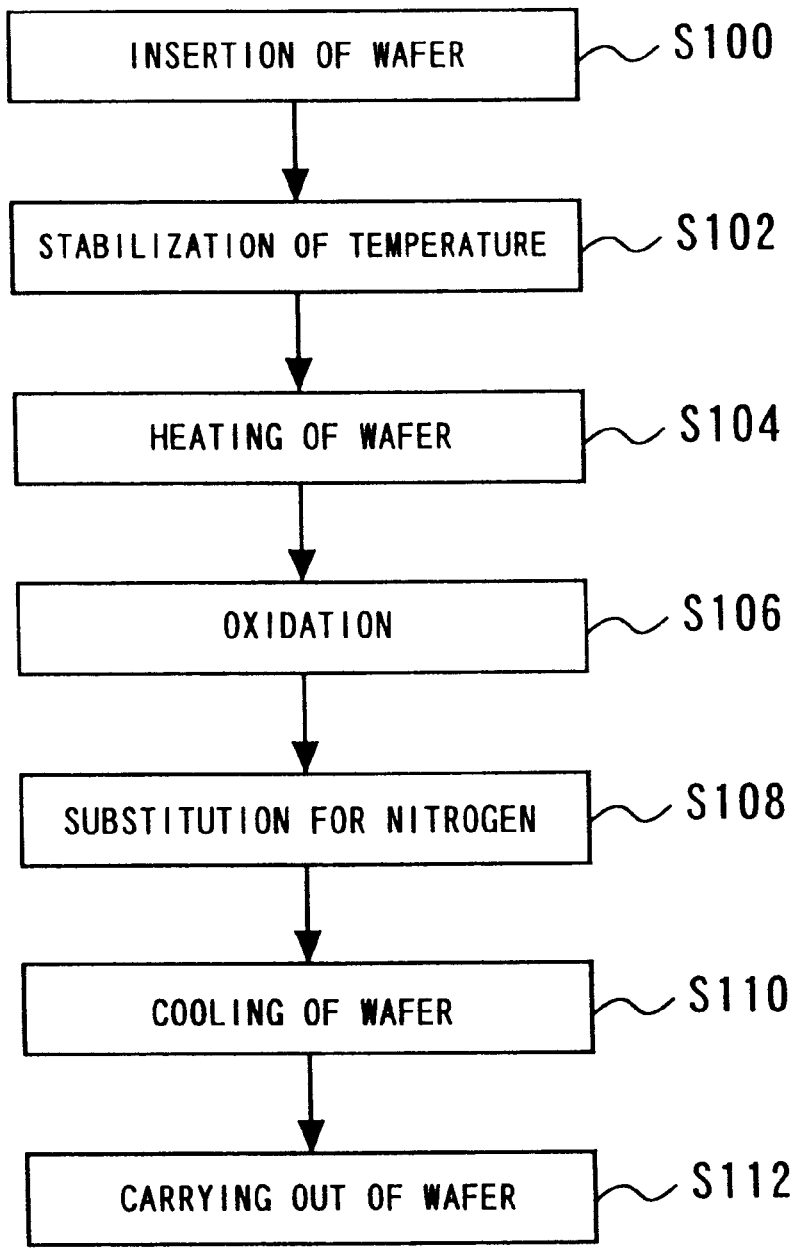
FIG. 4 is a flowchart showing a sequential processing steps performed by the apparatus shown in FIG. 3 for forming an oxidation film on a semiconductor wafer.

FIG. 1 is a configuration diagram of a vertical batch type oxidizing furnace as an apparatus for manufacturing a semiconductor device according to the first embodiment. The vertical batch type oxidizing furnace includes gas flow rate control units 10, 12 and 14 for controlling flow rates of nitrogen gas, oxygen gas and hydrogen gas, respectively. The gas flow rate control units 10, 12 and 14 are communicated to an external burning pipe 16. A burning heater 18 for burning hydrogen gas and oxygen gas to generate steam is provided around the external burning pipe 16.

A reaction chamber 22 is connected to the external burning pipe 16 via a gas inlet pipe 20. A heater 24 for heating the gas inlet pipe 20 and the reaction chamber 22 is provided around the gas inlet pipe 20 and the reaction chamber 22. Under the reaction chamber 22 is provided loading area 40. The loading area 40 and a space surrounded by the reaction chamber 22 is air-tightly sealed from the atmosphere in a clean room.

The loading area 40 is connected to gas flow rate control units 42 and 44. The gas flow rate control unit 42 is adapted to control the flow rate of nitrogen gas, and the gas flow rate control unit 44 is adapted to control the flow rate of oxygen gas. In the loading area 40 is provided a shutter plate 28 for sealing the inner space of the reaction chamber 22 from the atmosphere in the loading area 40.

A wafer boat 32 for holding a plurality of semiconductor wafers 30 is provided in the loading area 40. The wafer boat 32 is fixed on a boat lifter 36 via a boat holder 34. The boat lifter 36 can carry the wafer boat 32 in the reaction chamber 22 when the shutter plate 28 is opened, and seal the inner space of the reaction chamber 22 from the atmosphere in the loading area 40.

An exhaust passage 46 is connected to the reaction chamber 22. The exhaust passage 46 is communicated to atmospheric air via a valve 48 as well as via a valve 50 and a vacuum pump 52. Hereinafter, the passage including the valve 48 is referred to as a "usual exhaust passage 54", and the passage including the valve 50 and the vacuum pump 52 is referred to as an "evacuation passage 56".

An exhaust passage 58 is connected to the loading area 40. The exhaust passage 58 is communicated to atmospheric air via a valve 60 and to atmospheric air via a valve 62 and a vacuum pump 64. Hereinafter, the passage including the valve 60 is referred to as a "usual exhaust passage 66", and the passage including the valve 62 and the vacuum pump 64 is referred to as an "evacuation passage 68".

The vertical batch type oxidizing furnace in the first embodiment also includes a pressure sensor 70 and an oxygen concentration sensor 72. The pressure sensor 70 is adapted to measure a pressure in the reaction chamber 22 via the exhaust passage 46. The oxygen concentration sensor 72 is adapted to measure an oxygen concentration in the reaction chamber 22 via the valve 74 and the exhaust passage 46, and to measure an oxygen concentration in the loading area 40 via the valve 76.

Hereinafter, the operation of the vertical batch type oxidizing furnace in the first embodiment will be described with reference to FIG. 2. FIG. 2 is a flow chart showing sequential processing steps carried out for forming a polyoxide film using the vertical batch type oxidizing furnace in the first embodiment.

In the first embodiment, at Step S120, the oxygen concentration in the reaction chamber 22 and the oxygen concentration in the loading area 40 are both adjusted to a specific concentration. Concretely, at this step, the oxygen concentration in the reaction chamber 22 and the oxygen concentration in the loading area 40 are separately monitored by suitably switching the valves 74 and 76 from each other. Then, a mixed gas of oxygen and nitrogen or oxygen gas is supplied from the gas flow rate control units 10, 12, 42 and 44 into the reaction chamber 22 and the loading area 40 while the usual exhaust passages 54 and 66 are opened, so that oxygen concentrations in the both chamber 22 and area 40 accord with a specific value. The adjustment of the oxygen concentrations at this step is continued until both the oxygen concentrations coincide with each other at the specific value.

After the oxygen concentration in the reaction chamber 22 and the oxygen concentration in the loading area 40 coincide with each other at the specific value, at Step S122, the semiconductor wafers 30 held on the wafer boat 32 are inserted in the reaction chamber 22 by the boat lifter 36. At this moment, the reaction chamber 22 has been already heated at about 700° C. by the heater 24. Further, in the insertion stage of the semiconductor wafers 30, the supply of the gas, that is, the above-described mixed gas of oxygen and nitrogen or oxygen gas into the reaction chamber 22 and the loading area 40 is continued.

When the semiconductor wafers 30 are exposed to an atmosphere containing oxygen at a high temperature of about 700° C., organic matters and the like adhering on the surfaces of the semiconductor wafers 30 are removed by oxidation. In particular, according to the apparatus in the first embodiment, since the insertion of the semiconductor wafers 30 is started after the oxygen concentration in the reaction chamber 22 and the oxygen concentration in the loading area 40 coincide with each other at the specific value, the oxygen concentration in the reaction chamber 22 can be accurately equalized over the entire region thereof in the insertion stage of the semiconductor wafers 30. As a result, according to the apparatus in the first embodiment, the surfaces of the semiconductor wafers 30 can be uniformly oxidized in the insertion stage of the semiconductor wafers.

After the semiconductor wafers 30 are inserted in the reaction chamber 22, at Step S124, the state in which the above-described gas is supplied in the reaction chamber 22 is kept for a specific period of time in order to stabilize temperatures of the semiconductor wafers 30.

After the temperatures of the semiconductor wafers 30 are stabilized, at Step S126, the atmosphere in the reaction chamber 22 is substituted for a nitrogen atmosphere. To be more specific, at this step, the supply of the gas in the reaction chamber 22 is stopped, and the valve 48 is closed while the valve 50 is opened and the vacuum pump 52 is actuated. After the oxygen containing gas remaining in the reaction chamber 22 is evacuated via the evacuation passage 56, the vacuum pump 52 is stopped and the valve 50 is closed, followed by the supply of nitrogen gas in the reaction chamber 22. The supply of the nitrogen gas is continued until the pressure in the reaction chamber 22 coincides with atmospheric air pressure.

After the atmosphere in the reaction chamber 22 is substituted for the nitrogen atmosphere, at Step S128, the reaction chamber 22 is heated by the heater 24 until the wafer temperature reaches an oxidizing temperature, specifically, about 900° C. The semiconductor wafers 30 is not oxidized in the nitrogen atmosphere. Accordingly, the above treatment results in only increase of the wafer temperature without increasing the oxidized amounts on the surfaces of the semiconductor wafers 30.

After the wafer temperature reaches the oxidizing temperature, at Step S130, the nitrogen atmosphere in the reaction chamber 22 is substituted for the atmosphere of an oxidizing gas, that is, the mixed gas of oxygen and nitrogen. At this step, first, the supply of the nitrogen gas in the reaction, chamber 22 is stopped; then, nitrogen remaining in the reaction chamber 22 is evacuated via the evacuation passage 56. After the evacuation via the evacuation passage 56 is completed, the valve 50 is closed and the supply of the oxidizing gas in the reaction chamber 22 is started. The supply of the oxidizing gas is continued until the pressure in the reaction chamber 22 coincides with atmospheric air pressure.

When the pressure in the reaction chamber 22 coincides with atmospheric air pressure, at Step S132, the valve 48 is opened and the supply of the oxidizing gas is further continued. As a result, the oxidation of the semiconductor wafers 30 proceeds. In this oxidizing treatment, the flow rate of the oxidizing gas is controlled to a specific value by the gas flow rate control units 10 and 12. After an elapse of an oxidizing time required for ensuring a specific oxidized amount for each semiconductor wafer 30, the above-described oxidizing treatment is completed.

After the completion of the oxidizing treatment, at Step S134, the atmosphere in the reaction chamber 22 is substituted again for the nitrogen atmosphere, and also the atmosphere in the loading area 40 is substituted for the nitrogen atmosphere. The above substitution of the atmosphere is performed in accordance with the procedure including evacuation like the procedure at Step S126. To be more specific, at this step, the interiors of the reaction chamber 22 and the loading area 40 are evacuated through the evacuation passages 56 and 68, respectively, until the oxidizing gas in the reaction chamber 22 and the mixed gas or oxygen gas in the loading area 40 are discharged. After completion of the evacuation, the valves 50 and 62 are closed and the supply of nitrogen gas in the reaction chamber 22 and the loading area 40 is started. The supply of the nitrogen gas in the reaction chamber 22 and the loading area 40 is continued until the pressures in the reaction chamber 22 and the loading area 40 reach atmospheric air pressure.

After completion of the above-described substitution treatment, at Step S136, the semiconductor wafers 30 are held in the reaction chamber 22 until the temperature of the semiconductor wafers 30, that is, the temperature of the reaction chamber 22 is lowered to a specific value.

After the temperature of the semiconductor wafers 30 is lowered to the specific value, at Step S138, the semiconductor wafers are transferred from the reaction chamber 22 into the loading area 40. After the temperature of the semiconductor wafers 30 is sufficiently lowered, the semiconductor wafers 30 are carried out from the loading area 40.

As described above, the apparatus in the first embodiment can insert the semiconductor wafers 30 in the reaction chamber 22 while controlling the oxygen concentration in the reaction chamber 22 accurately and uniformly. Accordingly, the surfaces of the semiconductor wafers 30 can be uniformly oxidized in the insertion stage of the semiconductor wafers 30. As a result, in accordance with the apparatus in the first embodiment, it is possible to form a polyoxide film being superior in uniformity on the surface of each semiconductor wafer 30.

As described above, according to the apparatus in the first embodiment, it is also possible to unfailingly prevent the proceeding of oxidation of the wafer surface in the stage of heating the semiconductor wafers 30 which have been inserted in the reaction chamber 22 up to the oxidizing temperature. That is to say, in accordance with the procedure in the first embodiment, by adjusting the oxidizing time at the oxidizing step carried out after the temperature of the semiconductor wafers 30 reaches the oxidizing temperature, the thickness of the polyoxide film on the surface of each semiconductor wafer 30 can be accurately controlled. The apparatus in the first embodiment, therefore, can accurately form an extremely thin oxide film which has been difficult to be formed by the related art apparatus.

The apparatus in the first embodiment controls the oxidized amount of the surface of each semiconductor wafer 30 accurately, by substituting the nitrogen atmosphere in the reaction chamber 22 for the oxygen containing atmosphere, and vice versa. In the first embodiment, such substitution of the atmosphere can be completed for a short time by utilizing evacuation process in which the vacuum pumps 52 and 64 are employed. With this method, it is possible to shorten a transient time for which the oxygen concentration in the reaction chamber 22 is changed, and hence to eliminate the dependence of either the oxidizing rate or the organic matter removing ability on the wafer position in the reaction chamber.

Although the mixed gas of nitrogen and oxygen is used as the oxidizing gas in the above-described embodiment, the present invention is not limited thereto. For example, a gas obtained by diluting with helium the steam produced by reaction of hydrogen with oxygen may be used as the oxidizing gas. Even in the case of using such a gas as the oxidizing gas, the same effect as that obtained in the first embodiment can be obtained.

Although the polyoxide film is formed by oxidizing the surface of a polysilicon film in the above embodiment, the present invention is not limited thereto. For example, the present invention is applicable to the case of forming an oxide film by oxidizing the surface of a single crystal silicon film. Even in this case, the same effect as that obtained in the first embodiment can be obtained.

The major benefits of the present invention described above are summarized as follows:

According to the first aspect of the present invention, the oxygen concentration in the reaction chamber and the oxygen concentration in the loading area can be both accurately controlled. Then, the semiconductor wafers can be carried from the loading area into the reaction chamber when both the oxygen concentrations are accurately controlled. In this case, since the oxygen concentration in the reaction chamber in the insertion stage of the semiconductor wafers can be accurately controlled, the oxidized amount of the surface of each semiconductor wafer in the insertion stage of the semiconductor wafers can be accurately controlled. As a result, according to the present invention, it is possible to form a high quality oxide film being superior in uniformity on the surface of each semiconductor wafer.

According to the second aspect of the present invention, the semiconductor wafers can be inserted from the loading area into the reaction chamber after the oxygen concentration in the reaction chamber coincides with the oxygen concentration in the loading area. In this case, since there occurs no change in oxygen concentration in the reaction chamber in the insertion stage of the semiconductor wafers, the oxidized amount caused during the insertion stage of the semiconductor wafers can be equalized over the entire surface of each semiconductor wafer. As a result, according to the present invention, it is possible to form an oxide film being very superior in uniformity on the surface of each semiconductor wafer.

According to the third aspect of the present invention, the semiconductor wafers can be inserted from the loading area into the reaction chamber which has been already heated at a high temperature. Through the present invention, the entire surface of each semiconductor wafer is oxidized in the insertion stage of the semiconductor wafers and organic matters and the like adhering on the surface of each semiconductor wafer is, irrespective of the position thereof, suitably removed. As a result, according to the present invention, it is possible to form an oxide film being superior in uniformity on the entire surface of each semiconductor wafer.

According to the fourth aspect of the present invention, since the semiconductor wafers are inserted in the reaction chamber containing oxygen, organic matters and the like adhering on the wafer surface is removed by being oxidized during the insertion stage of the semiconductor wafers. Also, according to the present invention, since the semiconductor wafers are heated to the oxidizing temperature in the nitrogen atmosphere, the proceeding of oxidation is unfailingly prevented on the surface of each semiconductor wafer during the heating stage of the same. As a result, according to the present invention, it is possible to extremely accurately control the thickness of an oxide film and hence to form an extremely thin oxide film.

According to the fifth aspect of the present invention, the atmosphere in the reaction chamber is substituted for a desired gas by evacuating the gas in the reaction chamber once and then supplying the desired gas in the reaction chamber. In this case, it is possible to shorten the transient time for which the oxygen concentration is changed and hence to eliminate the dependence of the oxidizing rate and the organic matter removing ability on the wafer position in the reaction chamber.

According to the sixth aspect of the present invention, the entire surface of each semiconductor wafer is uniformly oxidized during the insertion stage of the semiconductor wafers and the oxidation of the surface of each semiconductor wafer is certainly prevent from proceeding during the heating stage of the semiconductor wafers. As a result, according to the present invention, it is possible to form an extremely thin film being very desirable in uniformity over the entire surface of each semiconductor wafer.

Further, the present invention is not limited to these embodiments, but variations and modifications may be made without departing from the scope of the present invention.

The entire disclosure of Japanese Patent Application No. Hei 11-190900 filed on Jul. 5, 1999 including specification, claims, drawings and summary are incorporated herein by reference in its entirety.

What is claimed is:

1. An apparatus for manufacturing a semiconductor device, which is used for forming a silicon oxide film on a semiconductor wafer, said apparatus comprising:

a reaction chamber for exposing the semiconductor wafer to an oxidizing gas at a specific oxidizing temperature;

a loading area capable of forming a sealed space in co-operation with said reaction chamber;

a separating member for separating the inner space in said reaction chamber from the inner space in said loading area;

a carrier for carrying said semiconductor wafer between the interior of said reaction chamber and the interior of said loading area;

a first gas flow rate control unit for controlling the flow rate of oxygen to flow in said reaction chamber;

a second gas flow rate control unit for controlling the flow rate of oxygen to flow in said loading area;

an oxygen concentration sensor capable of separately measuring an oxygen concentration in said reaction chamber and an oxygen concentration in said loading area; and a control unit for determining an insertion timing of said semiconductor wafer from said loading area into said reaction chamber on the basis of the oxygen concentration in said reaction chamber and said oxygen concentration in said loading area.

2. The apparatus for manufacturing a semiconductor device according to claim 1, wherein said control unit is operated to insert said semiconductor wafer from said loading area into said reaction chamber after the oxygen concentration in said reaction chamber coincides with the oxygen concentration in said loading area at a specific concentration.

3. The apparatus for manufacturing a semiconductor device according to claim 2, wherein said reaction chamber is heated at a temperature sufficiently higher than room temperature before said semiconductor wafer is inserted from said loading area into said reaction chamber.

4. An apparatus for manufacturing a semiconductor device, which is used for forming a silicon oxide film on a semiconductor wafer, said apparatus comprising:

a reaction chamber for exposing the semiconductor wafer to an oxidizing gas at a specific oxidizing temperature;

a heater for heating said reaction chamber;

a carrier for inserting the semiconductor wafer into said reaction chamber;

a third gas flow rate control unit for supplying an oxygen containing gas in said reaction chamber;

a fourth gas flow rate control unit for supplying nitrogen in said reaction chamber; and a control unit for inserting the semiconductor wafer in said reaction chamber when said reaction chamber is filled with the oxygen containing gas, substituting the atmosphere in said reaction chamber for nitrogen gas from the oxygen containing gas, and then heating said reaction chamber to a specific oxidizing temperature.

5. The apparatus for manufacturing a semiconductor device according to claim 4, further comprising:

a vacuum pump for discharging the gas in said reaction chamber;

wherein the control unit operates so as to discharge the oxygen containing gas from said reaction chamber by using said vacuum pump under a condition in which the supply of the gas to said reaction chamber is stopped, and to supply nitrogen into said reaction chamber during the substitution of the atmosphere in said reaction chamber.

6. The apparatus for manufacturing a semiconductor device according to claim 5, further comprising:

a loading area capable of forming a sealed space in co-operation with said reaction chamber;

a separating member for separating the inner space in said reaction chamber from the inner space in said loading area;

a first gas flow rate control unit for controlling the flow rate of oxygen to flow in said reaction chamber;

a second gas flow rate control unit for controlling the flow rate of oxygen to flow in said loading area; and an oxygen concentration sensor capable of separately measuring an oxygen concentration in said reaction chamber and an oxygen concentration in said loading area;

wherein said carrier carries the semiconductor wafer between the interior of said reaction chamber and the interior of said loading area; and said control unit determines an insertion timing of the semiconductor wafer from said loading area into said reaction chamber on the basis of the oxygen concentration in said reaction chamber and said oxygen concentration in said loading area.

* * * * *